United States Patent [19]

Watts

[11] Patent Number: 4,693,179
[45] Date of Patent: Sep. 15, 1987

[54] TEMPERATURE CONTROLLED ROTARY SCREEN PRINTING APPARATUS

[75] Inventor: John D. Watts, Woodbury, Conn.

[73] Assignee: Lockwood Technical, Inc., Monterey, Calif.

[21] Appl. No.: 793,675

[22] Filed: Oct. 31, 1985

Related U.S. Application Data

[63] Continuation-in-part of Ser. No. 679,996, Dec. 10, 1984, Pat. No. 4,627,345.

[51] Int. Cl.[4] .............................................. B41L 13/06
[52] U.S. Cl. ..................................... 101/119; 101/129; 118/667; 118/641; 219/216; 219/471; 219/502; 374/141
[58] Field of Search ................................. 219/469–471, 219/216 R, 502; 118/641, 667; 101/116–120, 129; 374/121, 141

[56] References Cited

U.S. PATENT DOCUMENTS

| | | | |
|---|---|---|---|
| 1,366,069 | 1/1921 | Doyle | 219/216 |
| 2,199,082 | 4/1940 | Peters | 374/121 |
| 2,382,920 | 8/1945 | Schaefer | 101/120 |
| 3,369,106 | 2/1968 | Troll | 219/471 |
| 3,379,857 | 4/1968 | Rosenstein | 219/471 |
| 3,742,191 | 6/1973 | Poole | 219/471 |
| 3,805,020 | 4/1974 | Bates | 219/471 |
| 3,862,574 | 1/1975 | Antoine | 374/121 |
| 4,134,664 | 1/1979 | Morokuma | 219/216 |
| 4,400,097 | 8/1983 | Koschnitzke | 374/121 |
| 4,425,489 | 1/1984 | Pav | 219/471 |
| 4,512,649 | 4/1985 | Derimiggio | 219/471 |
| 4,585,325 | 4/1986 | Euler | 219/470 |

FOREIGN PATENT DOCUMENTS

| | | | |
|---|---|---|---|
| 167951 | 7/1954 | Australia | 374/121 |
| 860616 | 1/1971 | Canada | 374/121 |
| 1914468 | 11/1970 | Fed. Rep. of Germany | 374/121 |
| 70882 | 6/1977 | Japan | 374/121 |
| 686594 | 1/1953 | United Kingdom | 374/121 |
| 275466 | 10/1970 | U.S.S.R. | 374/121 |

Primary Examiner—Clyde T. Coughenour
Attorney, Agent, or Firm—Paul L. Sjoquist

[57] ABSTRACT

A rotary screen printing apparatus for delivering coating fluid from the inside of a print cylinder through patterned openings onto an adjacent advancing substrate, having a print cylinder support frame, a drive mechanism for rotatably driving the print cylinder, a resilient suspension device for supporting the print cylinder at high rotational speeds, an adjacent radiant heater for generating heat energy for absorption by the print cylinder, an enclosure substantially surrounding the print cylinder and confining the radiated heat therein, at least one infrared sensor for sensing heat emitted from the print cylinder, and a control circuit for controlling the radiant heat energy from the heater in response to the sensed emitted radiant energy, about a manually controlled set point.

16 Claims, 13 Drawing Figures

TEMPERATURE CONTROLLED ROTARY SCREEN PRINTING APPARATUS

BACKGROUND OF THE INVENTION

This is a continuation-in-part of copending U.S. patent application Ser. No. 679,996, filed Dec. 10, 1984 now U.S. Pat. No. 4,627,345 issued 12/9/1986.

This invention relates to rotary screen printing machines and methods, and particularly to hot applications of heated inks, coatings, or adhesives to webs of paper, plastic, or fabric, or to rigid substrates, such as sheets of wood, plastic, metal, or glass.

The methods and apparatus of this invention are highly useful in the production of such materials as floor coverings, wall coverings, printed fabrics, laminates, artificial leather, transfer paper, packaging material, continuous paper products, printed circuit boards, and any other product where a continuous patterned application of an ambient, warm or hot fluid is required.

Conventional rotary screen printing methods and apparatus derived from silk-screen printing techniques, and the 1964 Reinke U.S. Pat. No. 3,155,034 shows an example of a silk-screen printing press for applying silk-screen impressions of ink to a continuous web of fabric or paper. Several patents of Stork Brabant B. V. of Boxmere, Holland, show later developments in rotary screen printing devices, for example, U.S. Pat. Nos. 4,384,521; 4,128,056; 4,006,683; 4,164,746; and 4,217,821.

Conventional rotary screen printing techniques typified by those shown in some of the foregoing patents utilize thin-walled, cylindrical sheets, preferably seamless, of nickel or its alloys, steel, synthetics, titanium, wholly or partially perforated to form screens and/or openings through which liquid inks or coatings are applied through the wall of the print cylinder to a flexible web or to a passing substrate rolling past the print cylinder. The perforated nickel print cylinders are preferably formed by electroplating on a mandrel having a very slight taper, from which they are removed after the electroplating deposition of the nickel is completed. Being extremely limp and flexible, they must be supported by so-called end rings telescopingly inserted in each end of the print cylinder in close wedging engagement, and preferably cemented in place by adhesives having the capability of operating at high temperatures to form a sturdy bond between the inner surface of each end of the print cylinder and the outer periphery of its telescoped end ring.

In order to maintain the thin-walled nickel print cylinder in its optimum cylindrical configuration without sagging or rotational deformation, it is essential that the end rings be spaced apart and maintained in a spaced apart relationship with sufficient force being applied to urge each end ring away from the opposite end ring in a manner transferring longitudinal tension loads to the thin-walled print cylinder. Conventional screen printing machines ordinarily secure the end rings firmly and rigidly in rotating mechanisms which are mounted and driven to rotate about the longitudinal axis of the print cylinder, actuated by anti-backlash gearing or other such mechanisms which require high precision manufacture. Print cylinders may be up to twelve feet long, and torsion loads tending to warp or twist the print cylinder, like ringing a towel, must be minimized or avoided to prevent buckling or wrinkling of the thin-walled print cylinder and consequent degradation of the imprinted pattern or indicia applied to the web or substrate.

These conventional, rigid end supports have required expensive mechanisms to assure the integral mounting of print cylinders on end rings, and the securing of end rings in rigid, rotating frames. Such costly rigid mounting devices conduct heat readily from the print cylinder to the support structures, and the application of hot liquid paint, ink, coatings, or adhesives has therefore been impossible or impractical, because overheating of the mounting devices has proved unavoidable in such conventional machines.

Attempts to apply heat to conventional print cylinders have also proved unsuccessful both because of this overheating of surrounding structures and because of extreme difficulties in controlling temperature with enough precision to assure the required viscosity of the applied liquid coating material. Small temperature changes often produce large viscosity changes in such coating materials. Temperature control within a few degrees Farenheit is necessary for proper coating, but difficult to achieve in actual practice.

SUMMARY OF THE INVENTION

The rotary screen printing units characterizing the present invention achieve precise temperature control while providing heat from two sources to maintain the optimum operating temperature for the print cylinder and the fluid being delivered to its interior and forced through its peripheral surface onto the passing web, achieving the precise fluid viscosity desired. Temperature control within two degrees Farenheit of the set point is routinely achieved by the devices of this invention.

The print cylinder is movable into engagement with an impression cylinder over which a moving web may travel, and when the print cylinder engages or passes the moving web, a doctor blade inside the print cylinder directs the liquid therein through the openings onto the moving web as it travels between the impression cylinder and the print cylinder. Liquid is delivered to the interior of the print cylinder through a central manifold extending partially or fully along the central interior zone of the print cylinder, in close proximity to an interior heating element.

An exterior radiant heating panel comprised of infrared radiation filament bands, with the radiating bands preferably extending transverse to the cylinder's axis, is arrayed in one or more longitudinal zones, with their radiation directed toward the central axis and the peripheral surface of the print cylinder. The edges of this infrared heating panel are enclosed by a rim flange which supports a shroud extending from the radiation panel into close proximity with the print cylinder. The shroud edges are closely spaced near the print cylinder to confine and redirect the infrared radiation thereon.

Air cooled optical infrared sensors extend through the shroud, aimed at the central axis of the heated print cylinder, and their temperature indicating output is delivered to proportional control circuitry governing the voltage supplied to the infrared heater. This closed loop feedback heat control system regulates print cylinder temperature within a narrow optimum range of desired set temperatures.

Unique end ring clamping devices make it unnecessary to have extremely precise end ring alignment perpendicular to the axis of the print cylinder, as required in U.S. Pat. No. 4,384,521, and by providing a flexible cushioned spring mounting for the print cylinder, the print cylinder is made self-aligning. In addition, heat transfer from the heated print cylinder to the surrounding support mechanism is drastically reduced, allowing the remainder of the device to operate at lower temperatures, while the temperature of the print cylinder can be closely controlled by its heat isolation from the supporting mechanism.

The precise temperature control governing the viscosity of the heated fluid cooperates with the fluid throughout control achieved by a cantilever cam-biased bridge, which positions the squeegee or doctor blade spanning the length of the print cylinder's interior near its point of tangency with the impression cylinder and the web traveling therebetween.

A pair of eccentric cams mounted in the cantilever support bridge for the doctor blade achieves its precise adjustment both in a radial direction, toward the interior surface of the print cylinder, and also in an angular direction around its interior surface. Radial adjustment of the doctor blade increases or reduces the pressure applied by the print cylinder to the web passing between the print cylinder and the impression cylinder, and angular movement of the doctor blade expands or contracts the fluid extrusion zone and the tangent printing zone of the web with the fluid extruded through the print cylinder wall, permitting a greater quantity of ink, adhesive, or coating fluid to pass through the print cylinder onto the moving web.

The print cylinder support frame is mounted for rolling contact with track grooves formed in the stationary base, and pneumatic cylinders on each side of the base control the advance or retraction of the print cylinder frame. Its advance is limited by one of the control cams in the doctor blade cantilever support bridge, and its retraction travel is limited by a cam dog and notch assembly. Print cylinder retraction is normally blocked during the operating mode of the device by a cam dog, governed by an eccentric cam, which is thereby engaged in its retraction limiting notch, while at the same time allowing the drive gears to remain engaged. When the cam dog is retracted and disengaged from the limiting notch, this allows full rolling retraction of the print cylinder support frame, and the drive gears become disengaged.

The driving torque for turning the two cylinders is delivered through one end of the impression cylinder shaft, which carries a spur gear engaged with a mating gear on a major idler clamped to one end of the print cylinder. The travel-limiting cam dog assures that minor adjustments in the axes of the two cylinders, tending to draw them apart, will always be limited to the depth of the spur gear teeth, thus assuring driving engagement of the impression cylinder gear with the print cylinder gear during the printing mode. Conversely, retraction of the print cylinder frame, when the cam dog is disengaged, automatically disengages the spur gears, and the print cylinder is no longer driven.

An extremely precise fluid level control system incorporates sensors responsive to at least two parameters, the web speed, and the actual level of the small amount of fluid riding in the print cylinder. The feed pump is adjusted roughly by a potentiometer to provide a predetermined amount of fluid feeding into the print cylinder through the manifold in direct ratio to web speed, so that a faster web speed will automatically provide a higher rate of feed. In addition, the level of fluid riding in the print cylinder is sensed by an optical, thermal, or hydraulic sensor, in order to avoid starving the printing operation, and thus both the web speed and the fluid level are employed in this closed loop system to assure that the printing operation is not starved for fluid.

The radiant infrared heater unit is bolted directly to the print cylinder frame, and advances and retracts as an integral unit with it. Thus, the print cylinder may be warmed up in its retracted position to bring the print cylinder and the fluid inside to the precise temperature desired before the cylinders are engaged and printing begins, thus minimizing any wasted web traveling through the printing unit before printing begins. This is also accomplished by energizing only the internal heater inside the print cylinder. Rotational support for the print cylinder is provided by a pair of major idlers whose grooved rims are engaged in correspondingly ridged rims of three minor idlers, the uppermost of which may be disengaged and removed for disassembly, and this also permits a change in major idlers to accommodate a larger or smaller print cylinder circumference, if necessary.

Spring-mounted hooked torque pins protruding inward from the facing surfaces of the ring-shaped major idlers are engageable in torque notches in the inner periphery of the end rings, which are cemented telescopingly inside the ends of the print cylinder. These short hooked torque rods perform the triple function of torque drive for the print cylinder, while maintaining circumferential registration and also exerting force resiliently drawing the end rings apart to tension the print cylinder longitudinally and minimize any sagging tendencies and rotational distortions without disrupting the cementing bond between the print cylinder and the end rings.

With short print cylinders, the torsional, twisting deformation of the print cylinder is negligible, and the cylinder itself transmits the torque required to rotate the major idler at its end opposite the driving spur gear. With long print cylinders, ten or twelve feet in length, a driving connection between two of the lower minor idlers, supporting the end-ring-mounting major idlers at each end of the print cylinder, transmits driving torque from the driven end to the opposite end of the print cylinder, thus reducing any tendency for torsional deformation, which might tend to produce wrinkling or buckling of the thin-walled print cylinder.

Accordingly, a principal object of the present invention is to provide economical and efficient rotary screen printing methods, and apparatus, utilizing perforated print cylinders formed with unique end rings eliminating the need for high precision, expensive, and rigid clamping in the support mechanism.

Another object of the invention is to provide such economical and efficient rotary screen printing apparatus virtually isolating the print cylinder from the support mechanism to minimize heat transfer, allowing the support mechanism to operate at cool temperatures while the print cylinder is heated to optimum operating temperatures for viscosity control of the printing fluid.

Still another object of the invention is to provide such rotary screen printing apparatus incorporating sensitively controlled and highly responsive radiant zoned heating of the outer surface of the print cylinder.

A further object of the invention is to provide such screen printing apparatus incorporating a sensitively controlled internal heater extending longitudinally down the interior of the print cylinder, to maintain the fluid manifold and the fluid riding inside the print cylinder at the optimum operating temperature for precise viscosity control.

Still another object of the invention is to provide such rotary screen printing apparatus in which temperature zones at successive positions along the longitudinal length of the print cylinder are maintained at different operating temperatures.

Another object of the invention is to provide such rotary screen printing apparatus in which the doctor blade extending along the interior surface of the print cylinder at its tangent zone is capable of precise adjustment in both angular and radial directions relative to the print cylinder surface.

A further object of the invention is to provide such rotary screen printing apparatus in which the print cylinder is mounted with its heater and its doctor blade adjustment means on a print cylinder frame which is movable toward and away from the impression cylinder, from an advanced printing position to a retracted position in which the print cylinder may remain engaged, or may be disengaged from the impression cylinder drive mechanism.

Another object of the invention is to provide such rotary screen printing apparatus in which the feed control is changed in response to web speed as well as fluid level carried in the print cylinder to assure that the printing operation is not starved or flooded for fluid.

Other objects of the invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

For a fuller understanding of the nature and objects of the invention, reference should be had to the following detailed description taken in connection with the accompanying drawings.

DESCRIPTION OF THE PREFERRED EMBODIMENT

Rotary screen printing units illustrated in the drawings incorporate the numerous features and advantages which characterize the present invention. Rotary screen printing techniques have become well known in industry, but numerous problems of rigid screen support and alignment have made it difficult or impossible to print with hot melt adhesives, or heated inks, or other heated materials or fluids or coating materials in conventional screen printing machinery.

The devices of this invention overcome these barriers and open new vistas for economical and highly efficient screen printing of many different flexible webs of paper, woven or felted fabrics or polymers, and many rigid or semi-rigid substrates, especially with warm or hot coating applications.

Figure 1:
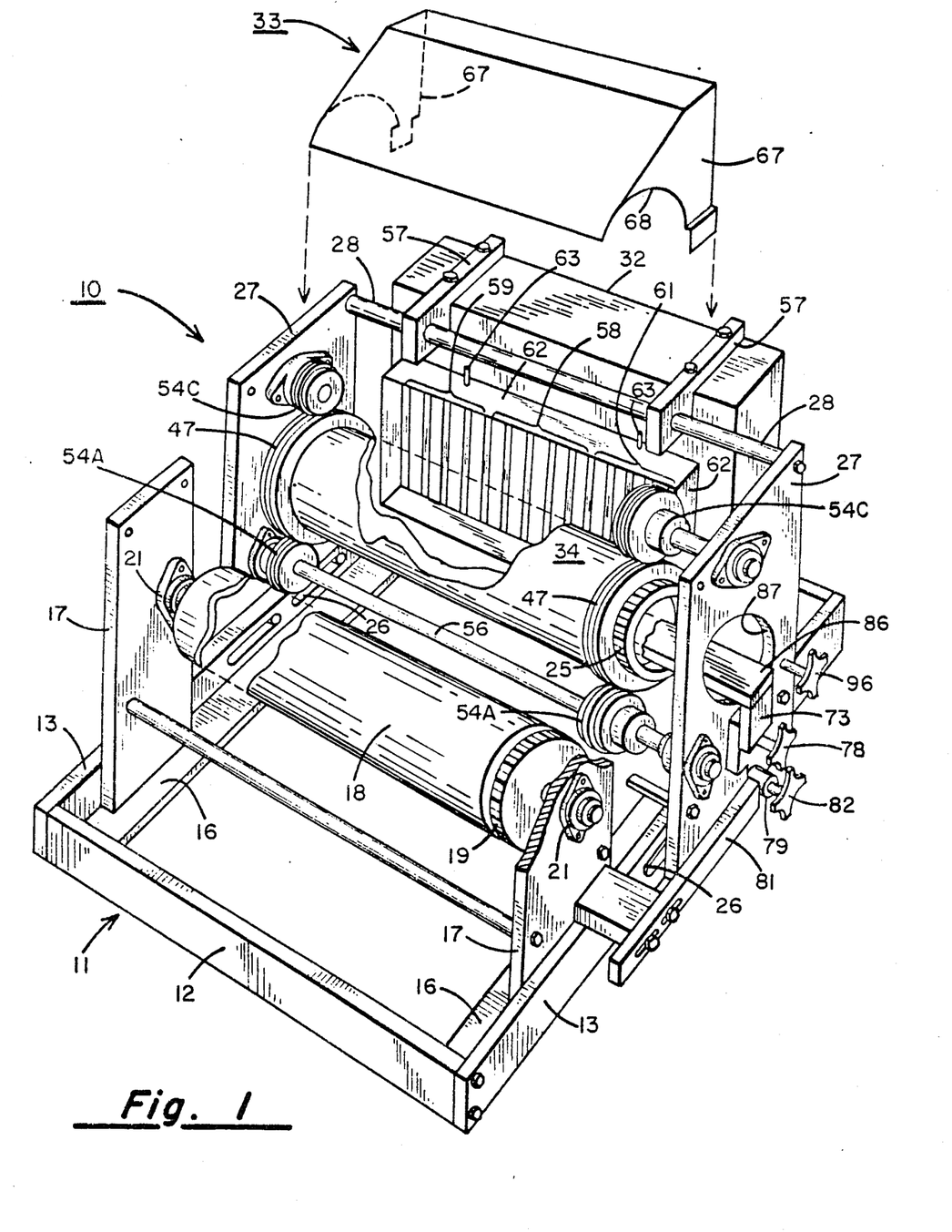
FIG. 1 is a perspective view of a rotary screen printing device of the present invention shown with its print cylinder disengaged from its impression cylinder to illustrate the details of construction and support of the print cylinder.
Figure 2:
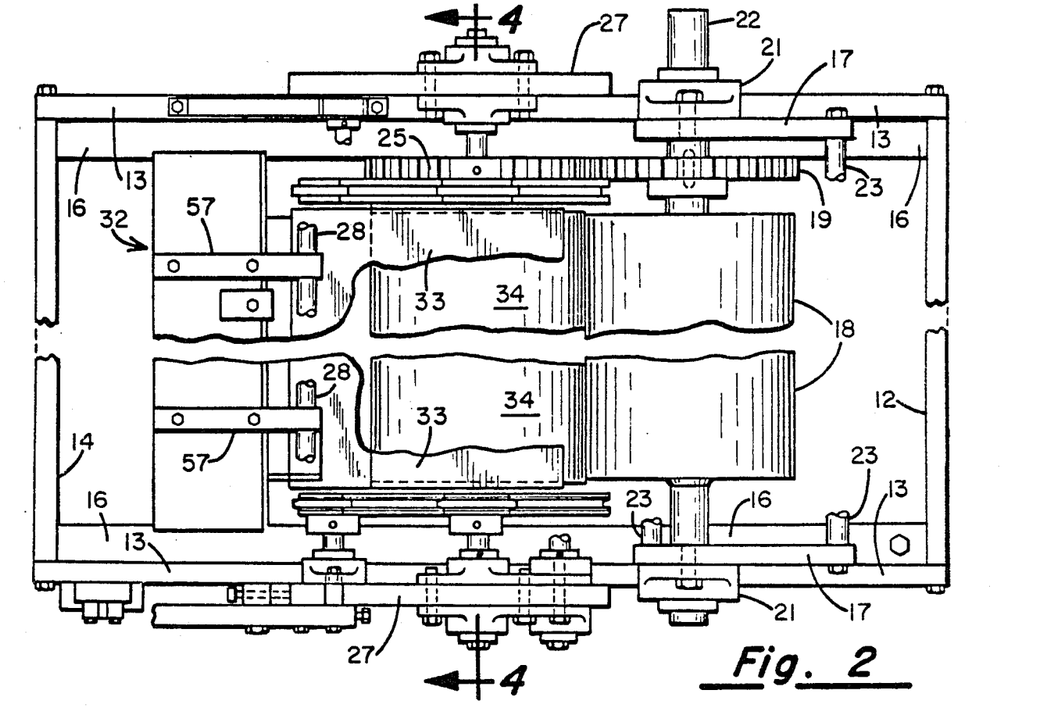
FIG. 2 is a top plan view of the same rotary screen printing device, shown partially broken away for clarity of illustration.
Figure 3:
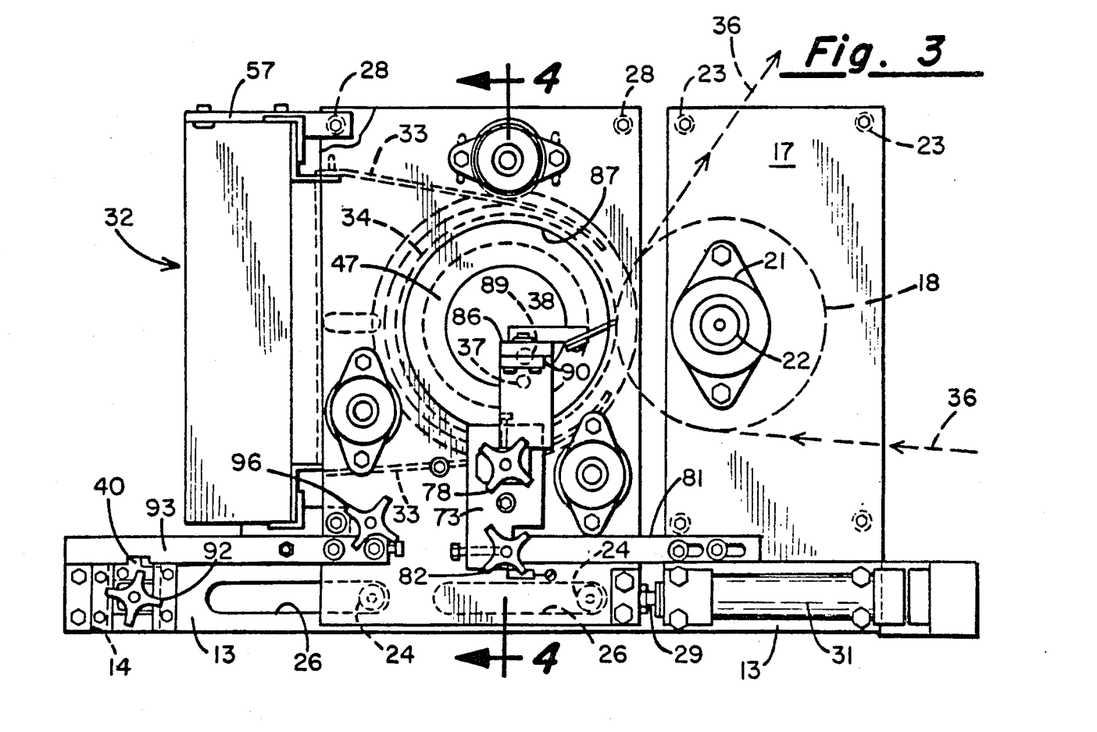
FIG. 3 is a side elevation view of the same rotary screen printing device, shown with its print cylinder advanced to its printing mode position, corresponding to the position shown in FIG. 2.

The principal subassemblies of the screen printing unit 10 of the present invention are shown in FIGS. 1, 2 and 3, mounted on a base frame 11. Frame 11 is generally rectangular in configuration, and comprises a front bar 12 having its ends sandwiched between and bolted to the front ends of a pair of side bars 13. A rear bar 14 similarly has its ends sandwiched between and bolted to the opposite rear ends of side bars 13, as best shown in FIG. 2. If desired, these side bars 13 may be L-shaped in configuration with flanges 16 extending inward and underlying the bars 12, 13 and 14. The flanges 16 may be unitary or fabricated separately and bolted to the undersides of side bars 13.

Stationary Frame and Impression Cylinder

A pair of matching, upstanding, stationary frames 17 is rigidly secured inside the forward ends of side bars 13. An impression cylinder 18 is centrally supported, spanning the space between these stationary frames 17, and is preferably formed of stainless steel, nickel-plated and polished to close tolerances generally of plus or minus 0.0004 inches, for example. Integrally secured to the right end of impression cylinder 18, as shown in FIG. 1, is a driving spur gear 19 whose pitch circle closely corresponds to the outside diameter of the impression cylinder 18, as indicated in FIG. 2. The assembly of impression cylinder 18 and driving spur gear 19 are rotatably mounted in end bearing mounts 21 shown in FIGS. 2 and 3, and the central shaft 22 of this rotating assembly extends outward beyond the right stationary frame 17, as shown in FIG. 2, for connection to a drive.

The impression cylinder 18 can be either heated or cooled, if desired, by circulating hot or cold fluid therethrough via a rotary joint on its drive shaft 22.

The upper end of each stationary frame 17 above the impression cylinder 18 is provided with transverse corner bores at its front and rear corners, and these accommodate bolts securing the ends of top bars 23, securely anchoring the upper ends of frame 17 together to form a sturdy, rigid, stationary front frame, providing virtually immovable support for the impression cylinder 18.

Retractable Print Cylinder Frame Assembly

Mounted on sturdy roller-bearing cam follower rollers 24, positioned in slots 26 formed in each side bar 13, are a pair of upstanding print cylinder support frames 27. The upper ends of frames 27 are rigidly joined together by top bars 28 extending transversely across the device and bolted to the respective upper corners of support frame 27, as shown in FIGS. 1 and 2. Corresponding bottom bars 30 are bolted joining the lower corners of frames 27. As indicated in FIG. 3, the forward lower corner of each support frame 27 is securely bolted to the distal end of a piston rod 29 extending from a double-acting air cylinder 31 which is anchored to the outside forward face of each side bar 13. Retraction of piston rod 29 within air cylinder 31 thus draws support frames 27 forward, with rollers 24 rolling in slots 26, to its forward position, illustrated in FIGS. 2, 3 and 6. Extension of piston rod 29 from air cylinder 31 drives support frames 27 rearwardly retracting the support frame a short distance toward the position shown in FIG. 1, with its retraction movement limited by cam dog assembly 40 at the rear end of each side bar 13. A heater assembly 32 is securely bolted to the rear portion of the print cylinder frame assembly to advance and retract with it in unitary fashion. A radiation shroud 33 extending forward from the heater 32 closely embraces the print cylinder 34, which is rotatably mounted on a transverse axis spanning the space between the two support frames 27 in a resilient self-aligning rotating mounting system hereinafter described in detail.

Air lines and valves, electrical control boxes and cables have been omitted from the drawings for simplicity of illustration.

As shown in FIGS. 2 and 3, the print cylinder 34 when advanced into its printing mode comes into printing proximity to the web and the impression cylinder 18, and the advancing web 36 travels between cylinders 18 and 34. As shown in FIG. 3, for example, the web 36 may enter the machine from its forward side between the two stationary side frames 17, traveling upward around impression cylinder 18 to be guided between it and print cylinder 34, and thence leaving the printing operation in an upward or forward direction. The printing methods and apparatus of the present invention are capable of great variation, and the direction of travel of the web or substrate being imprinted is not critical. The tangent zone between the print cylinder 34 and the impression cylinder 18 may be positioned at the bottom of the print cylinder with the entire assembly being rotated clockwise ninety degrees, and a flat rigid substrate may travel between the two cylinders. Thus, the printing zone portion of the print cylinder may be positioned at three o'clock, six o'clock, nine o'clock, or twelve o'clock positions around the periphery of the print cylinder, or at any other position desired, providing infinite variation in the positioning of the printing zone relative to the axis of the print cylinder.

Figure 6:
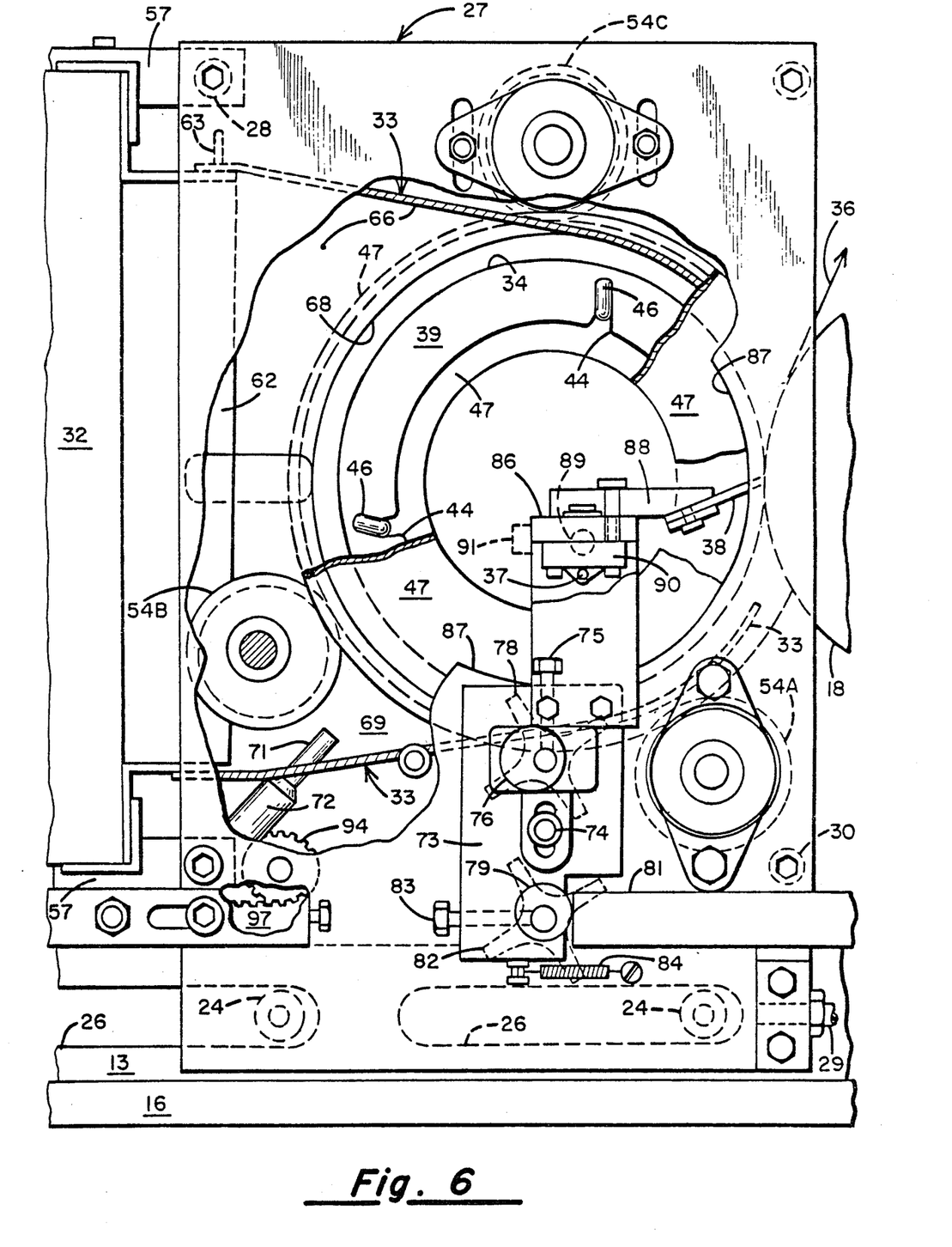
FIG. 6 is a greatly enlarged fragmentary end elevation view partially broken away, showing the print cylinder supported by the major idler and minor idlers, and substantially enclosed by the heat confining shroud extending from the infrared heater, and also showing the double cam cantilever doctor blade support mechanism and the rolling retraction track grooves for retracting the print cylinder frame from its printing mode position to its retracting position.

A fluid manifold 37 extends down the length of the print cylinder at or beneath its central axis, as indicated in FIGS. 3 and 6, with one or more delivery apertures being formed in this manifold to deliver fluid coating material, ink, or adhesive by gravity feed to the interior surface of the revolving print cylinder. In the illustrated embodiment of the invention, the print cylinder rotates in a counterclockwise direction, delivering this fluid up its lower right sector to a squeegee or doctor blade 38. The doctor blade may be positioned at any point around the periphery of the print cylinder, and if desired, the print cylinder rotation direction can be reversed, to deliver printing fluid in a clockwise direction. In this case the doctor blade 38 should also be reversed 180 degrees to form a converging angle with the advancing fluid as it arrives on the interior of the rotating print cylinder, so that it will be forced between the doctor blade and the print cylinder openings and thereby propelled through the openings onto the advancing web or substrate.

Print Cylinder End Ring Assembly

Figure 4:
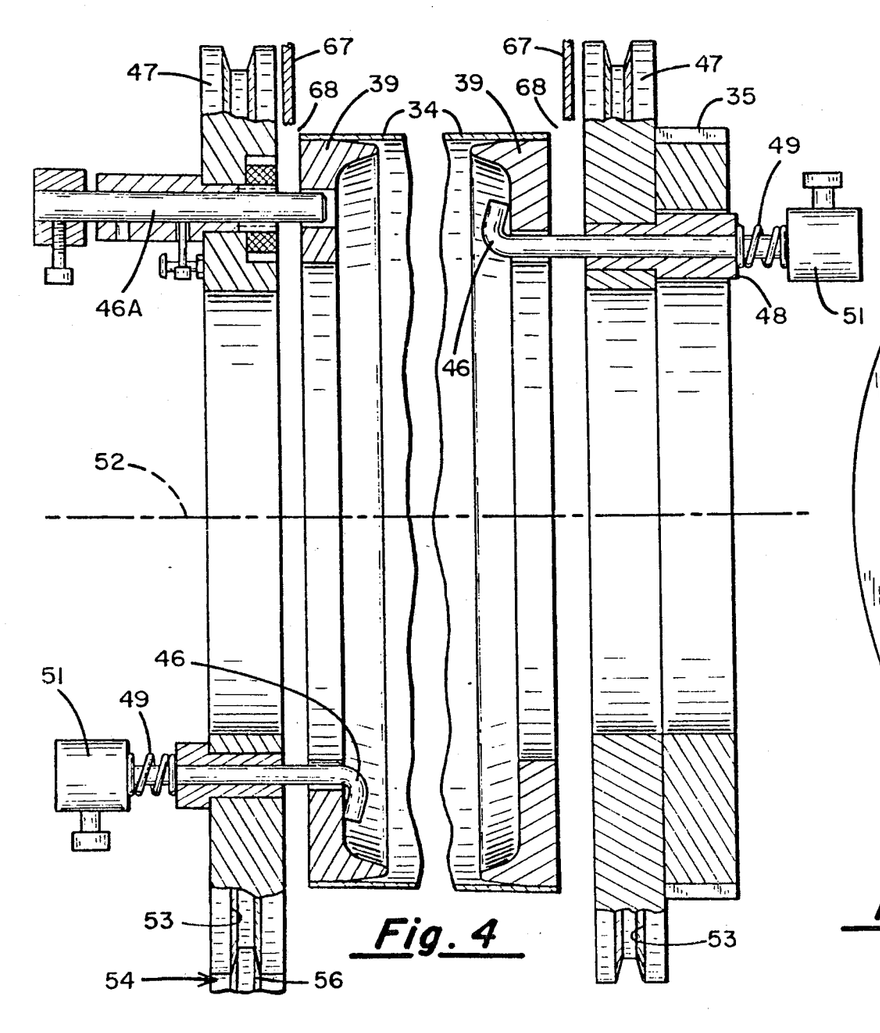
FIG. 4 is a greatly enlarged sectional elevation view, taken along the plane 4—4, shown in FIGS. 2 and 3, and broken away to illustrate the details of the print cylinder mounting devices of the present invention, which serve to isolate the heated print cylinder from the supporting mechanism.
Figures 7, 8:
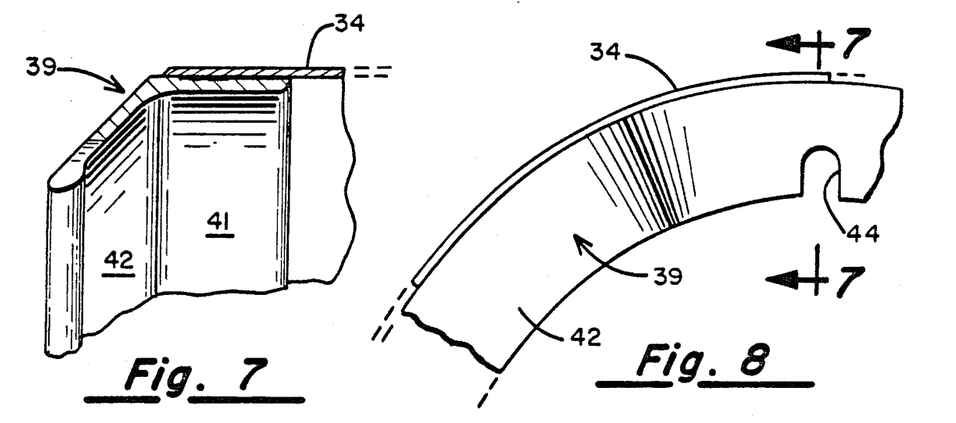
FIG. 7 is a fragmentary, greatly enlarged front elevation view of the print cylinder and one end ring cemented in its open end.
FIG. 8 is a corresponding fragmentary end elevation view of the same print cylinder and end ring.
Figure 9:
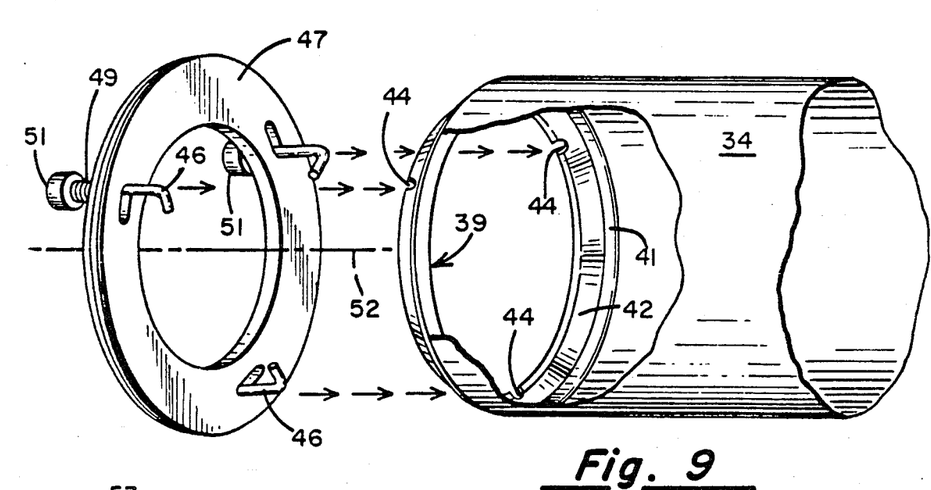
FIG. 9 is a fragmentary exploded perspective view of the assembled print cylinder and end ring with a ring-shaped major idler positioned for clamping attachment.
Figure 10:
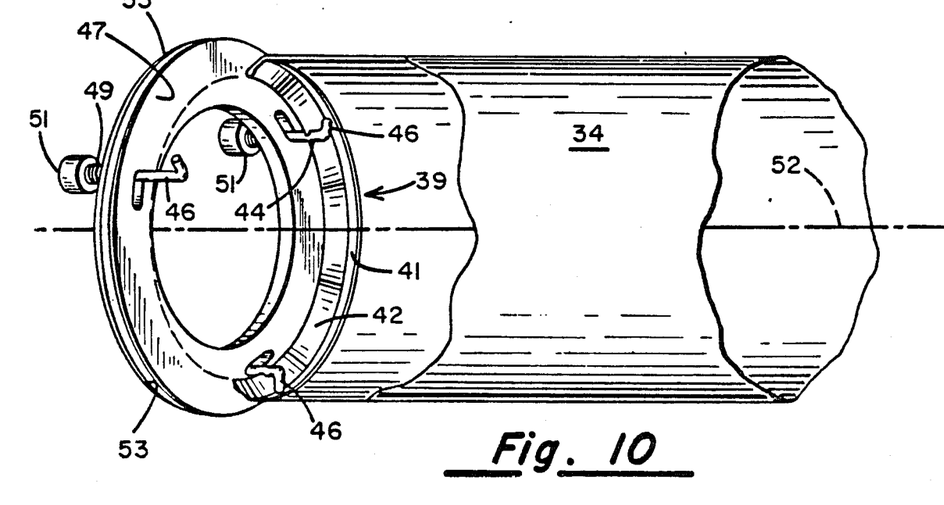
FIG. 10 is a corresponding perspective view of the same parts after their clamping attachment.

Shown in FIG. 4 and FIGS. 7-10 are the structural details of the self-aligning, resilient end-ring mounting assembly characterizing the present invention. The conventional nickel sheet print cylinder 34 of FIG. 2 is shown broken away in these drawings for clarity. The print cylinder is preferably seamless, and the interior peripheries of its circular ends are telescopingly engaged in a force fit around the exterior periphery of the end rings 39, which may be rectangular in cross section, or L-shaped, as shown in FIG. 4, or may have a flat inner ring flange 41 with a converging beveled outer mounting flange 42, providing a boomerang-shaped cross section, as shown in FIG. 7. In this angled configuration, the inner edge of mounting flange 42 is preferably provided with a bead 43. Regardless of the cross-sectional configuration of the end ring 39, it is provided with a plurality of at least three notches 44 formed in its interior or bead edge, as illustrated in FIGS. 7-10. These notches cooperate with a corresponding plurality of at least three short, hooked torque rods 46, protruding inwardly toward the end ring from its adjacent major idler. As shown in FIGS. 9 and 10, the torque rods 46 have their hooked ends swiveled inwardly toward the central axis 52 of the print cylinder 34 as the major idler 47 is brought into endwise juxtaposition next to the end ring 39, which has been installed in tight wedging engagement inside the interior periphery of the end of print cylinder 34, and cemented therein, preferably by an epoxy or other adhesive, to secure the end ring in position, in a plane substantially perpendicular to the longitudinal axis 52 of the print cylinder 34. With its torque rod hooks swiveled to the inner direction shown in FIG. 9, aimed generally toward the central axis 52 of major idler 47, this major idler is moved toward end ring 39 to bring its torque rods 46 into sliding engagement within notches 44.

With its torque rods engaged in notches 44, the torque rods can then be rotated to swing their hooked ends outwardly, aimed toward the print cylinder into hooked engagement with the interior of the end ring, as indicated in FIGS. 4 and 10. As shown in FIG. 4, each hooked torque rod 46 is mounted in axial sliding engagement inside a suitable bore or bushing 48 in its major idler 47, and in the case of the driven major idler, shown at the right side of FIG. 4, the bushing 48 extends through the driven spur gear 35, which is bolted to its major idler 47. With their terminal hooks aimed outward, in the position shown in FIGS. 4 and 10, the hooked torque rods 46 have their shanks engaged with the notches 44, thus securing the major idlers 47 to the print cylinder 34 by its end rings 39, whether these are rectangular, flat, or L-shaped in cross section, as shown in FIG. 4, or thin-walled, angled, cross sections with beveled flanges 41 and 42, as shown in FIGS. 7-10. In addition, by examining FIGS. 4 and 10, it will be noted that the hooked torque rods 46 are free to slide axially in the notches 44, leaving freedom for axial telescoping movement of the torque rods in the end ring. Thus, when the major idlers are mounted in their supporting minor idlers 54 positioned between the facing surfaces of the movable side wall or support frames 27 forming the print cylinder frame, the resilient mounting of these torque rods 46 maintains axial tension, tending to separate the two end rings 39 at the opposite ends of the print cylinder 34. Resilient force urging end rings 39 apart is supplied by compression coil springs 49, encircling the outermost ends of each of the torque rods 46, as shown in FIG. 4, and compressed between bushing 48 and torque rod cap knobs 51, secured to the outermost ends of the torque rods 46 opposite their hooks which engage the end rings 39.

Swiveling unhooking of torque rods 46 from end rings 39 permits them to slide axially outward, away from the print cylinder, with their hooks seated in short seat grooves 45 in each major idler 47, leaving ample clearance for removal of the print cylinder and end ring assembly.

The resilient force provided by springs 49 also produces a self-aligning rotational mounting of the perforated print cylinder 34 between major idlers 47, maintaining the thin-walled perforated sheet print cylinder 34 in axial tension, to minimize sagging and rotational distortion under the weight of the print cylinder and the print fluid carried in its interior during the printing operation An expensive prior proposal aiming at such self-alignment appears in U.S. Pat. No. 4,128,056, employing an O-ring type device clamped between the end ring and the drive mechanism, with no attempt at heat isolation of the print cylinder. This proposed device has a limited life and appears to be more complex than the present invention for use in a production environment.

The solid sturdy ring-shaped major idlers 47, illustrated in cross section in FIG. 4, contribute an additional advantage derived from their weight. As compared to the extremely light weight of the thin-walled print cylinder and the lightweight end rings, the major idlers and driven gear 35, forming the remainder of the rotating print cylinder assembly, account for a substantial portion of the weight of the assembly, the center of gravity of which is substantially precisely positioned at the rotational axis 52 of the print cylinder, providing excellent dynamic balance for the rotating assembly. The thin-walled perforated print cylinder and end rings 39 are likewise positioned by hooked torque rods 46 to bring their composite center of gravity into substantial coincidence with axis 52, leaving the coating liquid as the only unbalanced component of the overall print cylinder assembly not in dynamic equilibrium. The coating liquid is deposited from the central manifold by gravity on the interior wall of the rotating print cylinder and delivered thereby to the doctor blade 38. Since this controlled volume of coating fluid accounts for a relatively small proportion of the overall weight of the print cylinder assembly, high speed operation is possible without producing significant vibrations or dynamic imbalance, and the substantial weight of the major idlers 47 contributes significantly to this beneficial result.

Minor Idlers Supporting Major Idlers

Figure 5:
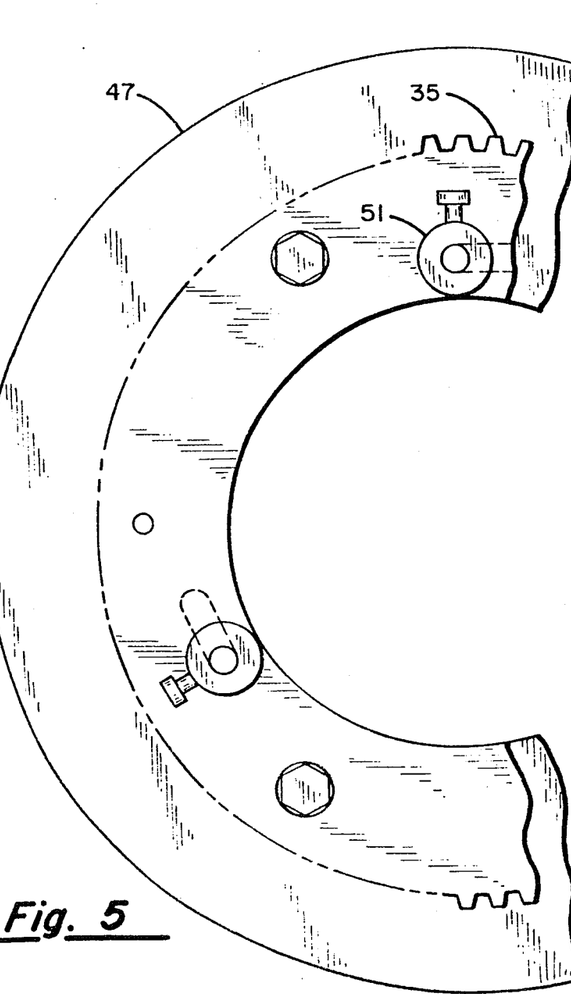
FIG. 5 is an end view, partially broken away, showing the drive major idler and spur gear assembly, shown at the right side of FIG. 4.

As illustrated in FIG. 5, each major idler 47, clamped by the resiliently mounted hooked torque rods 46 to the end rings 39 of print cylinder 34, is supported in a group of three minor idlers 54 rotatably mounted near the inner faces of print cylinder support frames 27, as indicated in FIG. 1. Each of the ring-shaped minor idlers is provided with a peripheral groove 53 around its outer rim, dimensioned for mating rolling engagement with a protruding rim flange encircling the periphery of each of three minor idlers, whose diameter is preferably between twenty and thirty percent of the diameter of the major idler 47. To prevent tangential displacement, or "skidding", these minor idlers 54 are preferably spaced ninety degrees or more apart around the periphery of the major idler 47.

As indicated in FIGS. 3 and 6, the lower front minor idler 54A is positioned beneath the forward side of print cylinder 34 below its print zone of tangent engagement with the web and its underlying impression cylinder 18. A second minor idler 54B is arrayed at an angle of ninety degrees or more in a clockwise direction around the rim of major idler 47 on the rear side of the major idler, and close to the heater 32. It should be noted that shroud 33 extends just inside this minor idler 54B and major idler 47, as shown at the top of FIG. 4. A third minor idler 54C is preferably positioned at or near the top of major idlor 47, as indicated in FIGS. 1, 3 and 6, forming a three-point rolling tractive support for major idler 47.

Substantially identical minor idlers 54A, B and C are mounted at the opposite end of print cylinder 34, straddling driven gear 35. Each of these groups of minor idlers thus supports its major idler 47 and thereby print cylinder 34.

Spacing between the opposing pairs of minor idlers on opposite sides of the print cylinder support frame 27 is maintained to position the major idlers 47 in substantially parallel planes in which their hooked torque rods 46, being drawn inward by the end rings 39 of print cylinder 34, produce slight compressive loads tending to reduce the overall length of compression springs 49. By this means, the print cylinder is maintained in axial tension, tending to minimize any sagging deformation of its thin-walled perforated cylindrical printing surface.

All of the minor idlers are mounted in sturdy bearing supports bolted to the side frames 27 and the uppermost minor idler 54C has its bolts set in vertical slots in frame 27, as shown in FIGS. 3 and 6, permitting slight loosening of its mounting nuts to provide sliding vertical leeway for disengagement of minor idler 54C from the rim of the major idler 47. After removal of the bridge assembly supporting the doctor blade 38, the hooked torque rods can be released and after removal of the upper portion of shroud 33, the print cylinder is free to be lifted out of its support frame for cleaning or changing to a different print cylinder.

The combined functions performed by the hooked torque rods 46 may, if desired, be divided among two different forms of torque rods: a plurality of straight torque rods like rod 46A, illustrated in the upper left portion of FIG. 4, engaging an axial bore formed in the end ring 39, and a plurality of hooked torque rods 46, shown in the other drawings. In this embodiment of the invention, the straight torque rod 46A provides driving torque and radial positioning of the print cylinder 34, maintaining it in alignment about its longitudinal axis 52 and causing it to rotate under the driving force supplied by driven gear 35, while the function of self-alignment counteracting any slight nonperpendicularity of either end ring 39 relative to axis 52, and the function of longitudinal tensioning of the print cylinder 34 to counteract sagging and rotational deformation thereof are both provided by the hooked torque rods 46. Three straight rods and three hooked rods may facilitate good torque drive with reduced tension loading, which may be desirable with a print cylinder made of vinyl. For metal sheet print cylinders, since the hooked torque rods 46 also provide the radial positioning and torque transmitting forces delivered from major idlers 47 to end rings 39, it is believed to be preferable to employ only hooked torque rods 46, to the exclusion of any straight end rods 46A.

The print cylinder 34 may be made in any convenient length and normally will be between two inches and twelve feet long and from ten inches to sixty inches in circumference, in any combination of these dimensions. Shorter lengths transmit driving torque loads directly through the cylinder 34 itself from driven gear 35, bolted to right major idler 47, all the way to the left major idler 47 without inducing torsional wrinkling or buckling of the thin-walled cylinder 34.

With longer cylinders, however, the risk of such torsional wrinkling or buckling can be minimized by providing a driving connection between the right and left major idlers 47. This connection preferably takes the form of a drive rod 56, spanning the distance between the two lower forward minor idlers 54A, and having its ends connected to each of those minor idlers by a Lovejoy coupling or other suitable, flexible coupling. By ganging the two lower forwardmost minor idlers 54A together, the right major idler 47 delivers driving torque through this assembly to the left major idler, assuring that both ends of print cylinder 34 will revolve together with minimum torsion loads being applied to the thin-walled perforated print cylinder itself.

It should be noted that the respective notches 44 in the two end rings at opposite ends of the print cylinder 34 need not be aligned and indeed may be angularly offset by thirty or forty degrees without any adverse effect on the operation of the device. Since each major idler is separately installed with its hooked torque rods inserted and engaged with the end rings independently, the assembly or print cylinder and major idlers is installed on its minor idler supports at each end of the device in free rolling contact therewith.

External and Internal Heaters For Print Cylinder and Manifold Assembly

The external heater generally indicated at 32 at the rear of the print cylinder frame assembly 27—27 is provided with sturdy brackets 57 along its top and bottom edges bolted to the external housing of the heater and anchoring it firmly to transverse rods 27 and 28, spanning the space between the upper corners and the lower corners of the two side frames 27, as shown in FIGS. 2, 3 and 6, as well as FIG. 1. Heater 32 is thus positioned spanning the entire rear zone of the print cylinder frame assembly 27—27, facing the print cylinder 34, with its heating elements being arrayed vertically to produce radiation directed toward the horizontal print cylinder.

These heating elements are preferably controlled by circuitry permitting independent proportional temperature variation as between different heat zones longitudinally arrayed along the length of cylinder 34.

For example, as indicated in FIG. 1, a total of 14 vertical infrared radiant heat bands are shown, and if desired these may be arranged in three separately controlled heating zones: a central zone 58 comprising the six central vertical bands of radiant heating filaments, a left end zone 59, and a right end zone 61 of four vertical bands each, which may be regulated separately or together to provide different temperatures for separate longitudinal sections of print cylinder 34. the number of heating zones and the number of radiant heat bands per zone may be changed as desired for different applications and lengths of print cylinders.

For example, if a design of perforations or openings formed in the print cylinder 34 is concentrated primarily in the central portion of the print cylinder, the central zone 58 may be brought to the preferred operating temperature for optimum fluid delivery through the print cylinder onto the advancing web, while the end zones 59 and 61 are maintained at lower temperatures to assure that the coating fluid reaching the ends of the print cylinder is maintained at the desired viscosity with regard to its gelling temperature and at a temperature below its char point, to avoid degradation. Lower viscosity and consequent gelling of coating inside the ends of the print cylinder may be desirable to retard migration of printing fluid away from the central printing zone, and the temperature control of the different zones 58, 59 and 61, of heater 32 are thus used to advantage to control the flow of printing fluid within the print cylinder 34.

Shroud 33, shown in FIGS. 1, 2, 3 and 6, extends from a rim flange 62 protruding forward from the heating element face of heater 32, having a width slightly wider than the length of the print cylinder 34. Two or more vertical posts 63 protrude upward from the uppermost portion of flange 62, in registration with corresponding apertures 64 in the rear uppermost portion of the removable upper part 66 of shroud 33. This upper shroud part 66, shown in FIG. 1, comprises an overhanging panel extending from the upper portion of flange 62 toward and above the print cylinder 34, with depending ends 67 having an arcuate lower edge 68 dimensioned for close juxtaposition with the end rings 39 of print cylinder 34. As shown in FIG. 4, these arcuate edges 68 preferably extend in overlapping relationship with the outer rim of each major idler 47, and actually protrude into the open space between each major idler 47 and its corresponding end ring 39.

By this means, the removable upper part 66 of shroud 33 and its generally similar stationary lower part 69, best seen in FIG. 6, together form an enclosure extending from the arrayed zones 58, 59 and 61 of heating elements forming the face of heater 32 and bounded by flange 62, closely embracing the entire periphery of the print cylinder 34 except for its forward printing portion. Upper and lower shroud portions 66 and 69 are preferably formed of sheet stainless steel whose interior surface is highly reflective, serving to direct the radiation from the various zones of heating elements by reflection upon a large portion of the periphery of print cylinder 34. The outside surface of both portions of shroud 33 is covered by a protective coating of heat-insulating paint, such as an epoxy paint. This heat-insulating coating as well as the reflective character of the interior surfaces of shroud 33 both serve to minimize the loss of ambient heat and radiant energy traveling from heater 32 to print cylinder 34.

For each separate zone of radiant filaments 58, 59 and 61, an individual, optical infrared sensor 71 is installed, protruding through a suitable aperture in the lower shroud portion 69, with its optic axis directed toward the center of the corresponding heated zone of print cylinder 34, aimed at the print cylinder axis and responsive to the actual temperature of the print cylinder surface at the central portion of the heated zone controlled by each sensor 71. Preferably, each sensor 71 is provided with an air cooling jacket 72 tending to counteract the effect of any stray radiation striking the protective housing of sensor 71, fed with compressed air from the source supplying air cylinder 31.

For the three zones 58, 59 and 61, there are three corresponding sensors 71 arrayed across the expanse of the lower shroud portion 69 and protruding through apertures therein, as indicated in FIG. 6.

It should be noted that the vertical orientation of the radiant heating filaments, transverse to the longitudinal axis of print cylinder 34, facilitates the subdivision of these arrayed vertical filaments into heating zones arrayed lengthwise along the length of the print cylinder, which may correspond closely to the distribution of openings forming the pattern of fluid being delivered by the print cylinder to the advancing web. The output of the sensors 71 is delivered to a microprocessor or other electronic control circuitry providing proportional control of the power supplied to each of the heating zones 58, 59 and 61, thus achieving the precise temperature control desired for optimum viscosity of the heating fluid inside the print cylinder.

Fluid Delivery Manifold

A bridge pedestal 73 is pivotally mounted by a shoulder bolt 74 to the lower central portion of the outside face of each print cylinder frame 27, as shown in FIGS. 3 and 6. Pedestal 73 is provided with a vertical slot, allowing it to move a short distance vertically relative to shoulder bolt 74. The vertical position of pedestal 73 is governed by an eccentric Y-cam 76 mounted on an elongated cam shaft extending transversely across the full width of the device, and keyed at its opposite end to a similar eccentric cam, cooperating with an identical bridge pedestal 73 pivotally mounted on the outer face of the opposite print cylinder frame 27. Y-cam 76 is positioned in a horizontally elongated follower slot 77, and both Y-cams 76 and their connecting shaft are free for manual rotation by the operator, utilizing a handle 78 presented at the left end of the Y-cam and shaft assembly, as shown in FIG. 6. Rotation of handle 78 by the operator revolves the eccentric cams in cooperation with the horizontal elongated slots 77, raising and lowering both pedestals 73 simultaneously. After final adjustment, the Y-cam 76 is secured with a lock bolt 75.

A pair of comparable X-cams 79 eccentrically keyed to a connecting shaft journaled at the lower end of each pedestal 73 is presented for engagement with a forward cam stop bar 81, adjustably bolted to the stationary impression cylinder frame 17 and providing a forward stop against which each cam 79 on the movable print cylinder frame abuts and comes to rest at the end of its forward travel, bringing the cylinders 34 and 18 into juxtaposition.

Manual adjustment of eccentric X-cam 79 by the operator, utilizing a similar handle 82 presented below Y-cam adjustment handle 78 on the left side of the machine, as shown in FIGS. 3 and 6, causes pivoting movement of pedestal 73 about pivot bolt 74, increasing or decreasing the distance between the shaft joining X-cams 79 and the end of cam stop bar 81. An enlarged aperture formed in each frame 27 accommodates the forward movement of this X-cam shaft as it pivots pedestals 73 to move angularly a short distance about pivot bolts 74. A set bolt 83 threaded into pedestal 73 clamps the X-cam shaft in any adjusted position desired.

A resilient tension spring 84 has one end anchored to frame 27 and the opposite end anchored to the bottom of pedestal 73 to urge the cams 79 on pedestals 73 into contact with stop bars 81, tending to rotate each pedestal counterclockwise about its pivot bolt 74, as shown in FIG. 6.

Mounted at the upper end of each pedestal 73 is a removable bridge 86 formed as an elongated bar extending down the central cavity inside print cylinder 34 from one end to the other, and protruding therefrom past the major idlers 47 and through a large corresponding aperture 87 formed in each side of the print cylinder frame 27, to have its ends respectively bolted to the upper end of one of the vertically extending bridge pedestals 73. These bolt connections between bridge 86 and its two supporting pedestals 73 are substantially identical, except that one of these bolt connections preferably incorporates slot means, accommodating thermal expansion of bridge 86 and allowing it to expand lengthwise inside the heated print cylinder 34 without affecting its position relative to pedestals 73. Bolted to bridge 86 is a squeegee support bracket 88, extending from bridge 86 toward the inside of the print cylinder 34, and supporting at its outermost end via suitable bolts the slanting doctor blade or squeegee 38, which extends into close converging proximity with the interior of the print cylinder 34.

The Y-cams 76 and X-cams 79 provide extremely precise positioning for the squeegee 38 relative to the print cylinder 34, since adjustment of the Y-cam in slot 77 raises the squeegee causing its angular adjustment upward or downward inside the periphery of the print cylinder relative to its point of closest proximity to the advancing web, while adjustment of X-cams 79 draws the squeegee 38 closer to or farther from the interior of print cylinder 34.

"Jogging" control of the device is provided by switching circuitry actuating the air cylinder 31. Piston rod 29 secured to the lower front corners of print cylinder support frame 27, thus causes slight rearward movement of each frame 27 within the limits permitted by cam dog 40, positioned at the lower left corner of FIG. 3. This jogging rearward movement moves the entire frame 27, carrying pedestal 73, bridge 86, squeegee 38 rearwardly a short distance, withdrawing the print cylinder from printing proximity with the advancing web. Simultaneously, tension spring 84 draws the two pivoting pedestals 73 a short distance in a counterclockwise direction about the pivot bolts 74, limited only by the contact of stop bar 81, and the resulting slight pivoting rotation of pedestals 73 withdraws squeegee 38 a predetermined distance from the interior of print cylinder 34. Thus, a single jogging control simultaneously withdraws the print cylinder from the advancing web and withdraws the squeegee from the print cylinder's interior surface, preventing further printing fluid feed through openings in the print cylinder 34 and preventing the transfer of fluid from the cylinder to the advancing web by this slight rearward spacing.

The doctor blade may be made of spring steel or stainless steel, and in many cases a flexible doctor blade of Teflon or other polymers, elastomer, silicone rubber for high temperature applications, or combinations thereof can be used to produce a wider angular printing zone of fluid passing through the print cylinder.

Sandwiched between bridge 86 and a heater support plate 90 bolted thereto is an electrical heating element 89, connected by a detachable plug and socket wiring connection to the external control circuitry and preferably provided with proportional control, governed by temperature sensors 91 adjacent to heating element 89, mounted directly on bridge 86 and also connected to the control circuitry by detachable plug and socket wiring connection. Suspended beneath bridge 86 throughout its length, or any portion of its length which may be required, is a fluid delivery manifold 37, shown in endwise section in FIG. 6. Delivery manifold 37 may be formed of light, flexible metal tubing, such as automotive brake line tubing, provided with suitable apertures at desired positions and intervals along its length, to provide delivery streams of coating fluid descending therefrom to the inside of rotating print cylinder 34. Manifold 37 is connected to the fluid supply and feed system, not shown in the drawings, by suitable detachable tubing connections, similar to plumbing unions.

Detachment of the tubing connections to manifold 37 and the electrical connections to heating element 89 and its accompanying adjacent heat sensors 91 permits the unbolting and removal of the entire bridge 86 carrying these devices as well as squeegee support bracket 88 and squeegee or doctor blade 38 from the interior of the print cylinder 34, withdrawing this assembly endwise through one of the openings 87 in print cylinder frame 27 at either side of the device. By utilizing bridge heater 89 with its temperature sensors 91 closely adjacent to feed manifold 37, the temperature of the coating fluid arriving at the interior of print cylinder 34 and being delivered to its interior surface can be closely controlled and substantially matched if desired with the optimum viscosity-temperature at which the print cylinder itself is held by sensors 71 controlling heater 32.

Rearward Retraction of Print Cylinder Frame Assembly

When access is required to the interior of the printing units of this invention, convenient means are provided for moving print cylinder 34 into a rear retracted position removed from the vicinity of the impression cylinder 18. This is accomplished by manual operation of two additional handles presented on the outer face of the device, as illustrated in FIGS. 3 and 6. A cam-dog handle 92 at the lower left rear portion of the device near the rear end of the left side bar 13 permits the manual rotation of an eccentric cam, lowering the cam dog 40 from its notch in notch bar 93, which is adjustably bolted protruding rearwardly from the lower rear corner of print cylinder frame 27 on the left side of the device. After the cam-dog assembly 40 is disengaged from its notch bar 93, rearward movement or frames 27 disengaging the gears 19 and 35 is unimpeded by the dog assembly.

Frames 27 are thus free to move rearwardly on follower rollers 24 rolling in slots 26 in each side bar 13. Rearward movement is produced by a pair of retraction gears 94 journaled on the inside of the lower corner of each print cylinder frame 27 for rotation relative to the frame and keyed to opposite ends of a retraction gear shaft spanning the width of the device between the two frames 27, below shroud 33, with a retraction handle 96 presented on the outer face of the left frame 27 to the rear of the handles 78 and 82. Each of the gears 94 is meshed with a toothed rack 97 positioned horizontally and mounted on the inner face of each of the print cylinder frames 27. Rotation of retraction gear 94 thus drives each rack 97 and frame 27 toward the rear, withdrawing the print cylinder 34 and heater 32 and all of the associated subassemblies toward the retracted position, shown in FIG. 1.

If desired, the mounting attachment of the frame 18 and the frame 27 may be reversed, to make the impression cylinder 18 retractable away from print cylinder 34. In this case, the print cylinder frames 27 are mounted as stationary frames, while the impression cylinder support frames 17 are mounted by roller slot mountings, similar to mountings 24–26, and a retraction gear rack assembly, similar to 94–97, connects the impression cylinder frames to the base.

Fluid Feed Control

The level of fluid delivered to manifold 37 by the feed supply and pump, not shown in the drawings, is governed by electronic control circuitry responsive to two different parameters: the web speed governs the throughput volume of fluid delivered by the pump, while optical, thermal, or hydraulic sensing of the level in the bottom of the print cylinder is also employed to assure sufficient fluid delivered through manifold 37 to maintain the desired level of coating fluid in the print cylinder 34. Sensors 91 and 71 governing the heaters 89 and 32 cooperate with this feed control circuitry to maintain the coating fluid at the precise optimum viscosity, utilizing proportional control rather than "on-off" control to maintain desired fluid temperatures within close tolerances. If desired, the manifold 37 may be provided with only one or a few delivery apertures to bring coating fluid to the precise longitudinal position in print cylinder 34 where it is desired for printing. Sensor 91 on bridge 86 is preferably a high tolerance thermocouple, a remote temperature device whose output is fed into a proportional controller governing a power supply for the internal heater 89 mounted on bridge 86.

Extremely precise temperature control employing heating elements both inside and outside print cylinder 34 cooperating with precise fluid delivery feed control producing optimum fluid printing viscosity thus adapt the rotary screen printing devices of this invention for highly efficient hot coating of advancing webs and substrates of all kinds. The heat isolation of the print cylinder and its end rings from the idlers 47 and the associated supporting drive mechanism, utilizing hooked torque rods 46 and shroud 33, facilitate temperature control and minimize harmful effects of heat upon the external portions of the device. Eccentric cams governing the X and Y-axis positions of the squeegee provide extremely precise squeegee positioning and fluid delivery pressure through openings in the print cylinder onto the advancing substrate, and the unique torque drive and self-aligning mounting for the print cylinder provides a highly effective rotary screen printing device at minimum cost.

Temperature Control System

One of the principal uses intended for the present apparatus is the application of industrial adhesives which are fed through the fluid delivery manifold 37 inside of the print cylinder, and which is metered to the inside surface of the print cylinder by the doctor blade or squeegee 38, and is applied to a high speed web traveling adjacent to the print cylinder through openings in the print cylinder which conveniently form a preferred application pattern. The adhesive material is typically raised to an elevated temperature in passing through the fluid delivery manifold, which is necessary in order to reduce the viscosity of the adhesive material to a point where it will flow freely. Viscosity control of the adhesive material is extremely critical to its proper application, for the material quickly becomes viscous upon very slight degrees of cooling, and in a viscous condition will not properly flow through the patterned openings on the print cylinder. If the temperature of the adhesive material is raised too high, too much material may be delivered through the patterned openings on the print cylinder, and at sufficiently high temperatures the adhesive material will char and flake and thereby destroy the work product.

It is the temperature of the adhesive material at the point where it is applied through the print cylinder that is critical, for the adhesive material's viscosity is extremely critical in order to achieve proper metering through the patterned print cylinder with the doctor blade. It is therefore necessary to separately heat the print cylinder itself, in order to assure close control of the temperature of the adhesive at the surface of the print cylinder.

Figure 11:
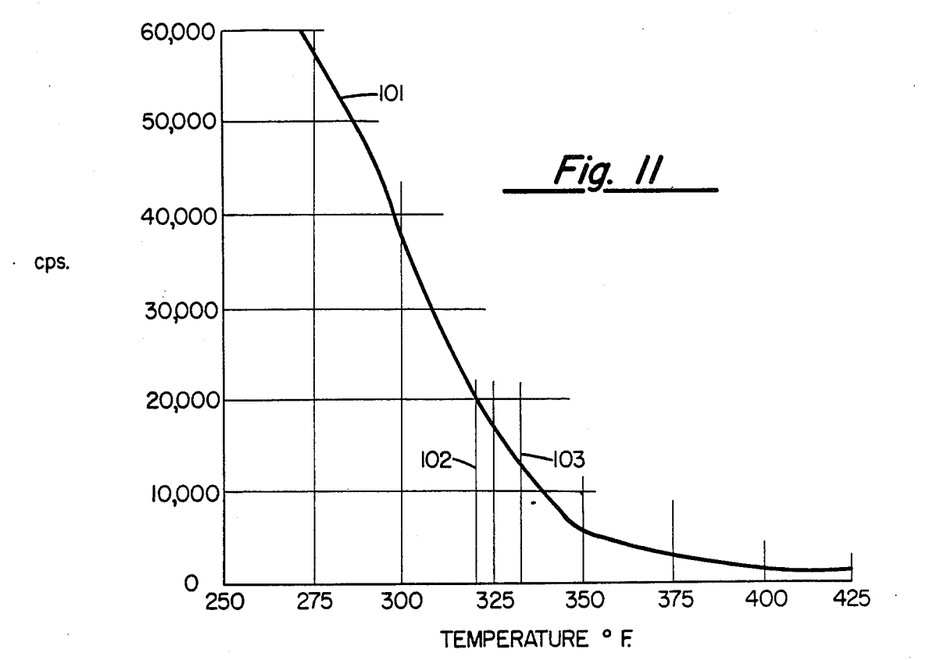
FIG. 11 shows a typical temperature viscosity curve for industrial adhesives.

FIG. 11 shows a typical viscosity curve for liquid adhesives of the type useful with the present invention. The curve shows that viscosity drops rapidly and fairly linearly as temperature rises, up to an elevated temperature in the range of 350° Farenheit (°F.). At temperatures higher than 350° F., the viscosity changes very little, and at some elevated temperature at or above 350° F. the adhesive material will actually begin to char. The application of adhesives which exhibit these characteristics is most appropriately made near the point of lowest viscosity, but before the "knee" of the curve wherein the viscosity begins to become insensitive to further elevation of temperature. In practice, a fairly narrow range of temperatures is preferred for the application of these adhesives through a print cylinder.

The problem of precisely controlling such liquid adhesives at the point where they are applied through the print cylinder perforations is complex, for it is impossible to physically place a temperature probe at the point where the adhesive temperature is the most critical, i.e., at the actual point of passing through the print cylinder perforations. Further, it is impractical to directly measure the adhesive temperature by measuring the temperature of the print cylinder, because the print cylinder is typically formed of very thin metallic material which will not support a temperature probe without deformation of the cylinder. Therefore, the present invention includes a temperature sensing system which measures the temperature of the print cylinder surface indirectly, by measuring its thermal emissivity.

The emissivity of the material is exactly defined as being equal to the heat energy of absorption of the material. In the presence of radiant infrared energy all materials will exhibit absorption, reflectivity, and transmittance. These quantities are usually expressed as coefficients, their sum being defined equal to one, and therefore a material's absorption coefficient plus its reflectivity coefficient plus its transmittance coefficient are defined as being equal to one. The absorption coefficient is a measure of the degree to which a material will absorb heat energy; the reflectivity coefficient is a measure of the amount of heat energy which will reflect from the surface of the material; the transmittance coefficient is a measure of the amount of heat energy which will pass through the material without being absorbed. It can be demonstrated that the relative ability of the material to radiate energy, or its emissivity, is exactly equal to its coefficient of absorption, i.e., its ability to absorb energy. The measure of emissivity therefore provides a measure of the material's ability to absorb heat energy, and the temperature of the material can be derived therefrom.

In the case of a rotating print cylinder constructed of very thin, usually metallic, material, the emissivity is generally quite low. In the case of a rotating print cylinder having a film of liquid adhesive applied to its interior surface, the emissivity of the combination of these two materials is generally higher, with a significant amount of the emissivity contribution coming from the liquid adhesive material rather than from the relatively thin, low mass print cylinder surface. Therefore, an infrared sensor which is calibrated to measure emissivity from the surface of the print cylinder provides a very close approximation of the actual temperature of the liquid adhesive material which is applied to the print cylinder.

As stated hereinbefore, FIG. 11 shows a typical viscosity curve for liquid adhesives of the type useful with the present invention. The vertical scale index is a measure of viscosity, usually stated in centipoise, and in the example shown in FIG. 11 ranges from 0 to 60,000 centipoise (cps). The horizontal scale represents temperature, usually stated in degrees Farenheit (°F.). In the example shown in FIG. 11, the temperature scale varies from 250° F.–425° F. The curve 101 represents a typical viscosity-temperature characteristic of an industrial adhesive material, commonly known as "hot melt" material. Such materials exhibit characteristics of a solid at room temperature, and at elevated temperatures take on the characteristics of a liquid of varying viscosity. They are useful for bonding a wide variety of substrates, and are extremely fast setting when the temperature is cooled. The temperature of application is a function of the desired viscosity characteristics in any particular application, and in conjunction with the present invention it is important that viscosity be closely controlled in order to achieve the desired flow characteristics through the patterned openings of the rotating print cylinder. For example, the example shown in FIG. 11 assumes a viscosity requirement of 16,000 cps plus or minus 4,000 cps for optimum application of the hot melt material represented by curve 101. This requires a temperature control of the material as it is applied through the print cylinder openings from 320° F. to approximately 332° F. This range is shown by vertical lines 102 and 103 in FIG. 11.

Figure 12:
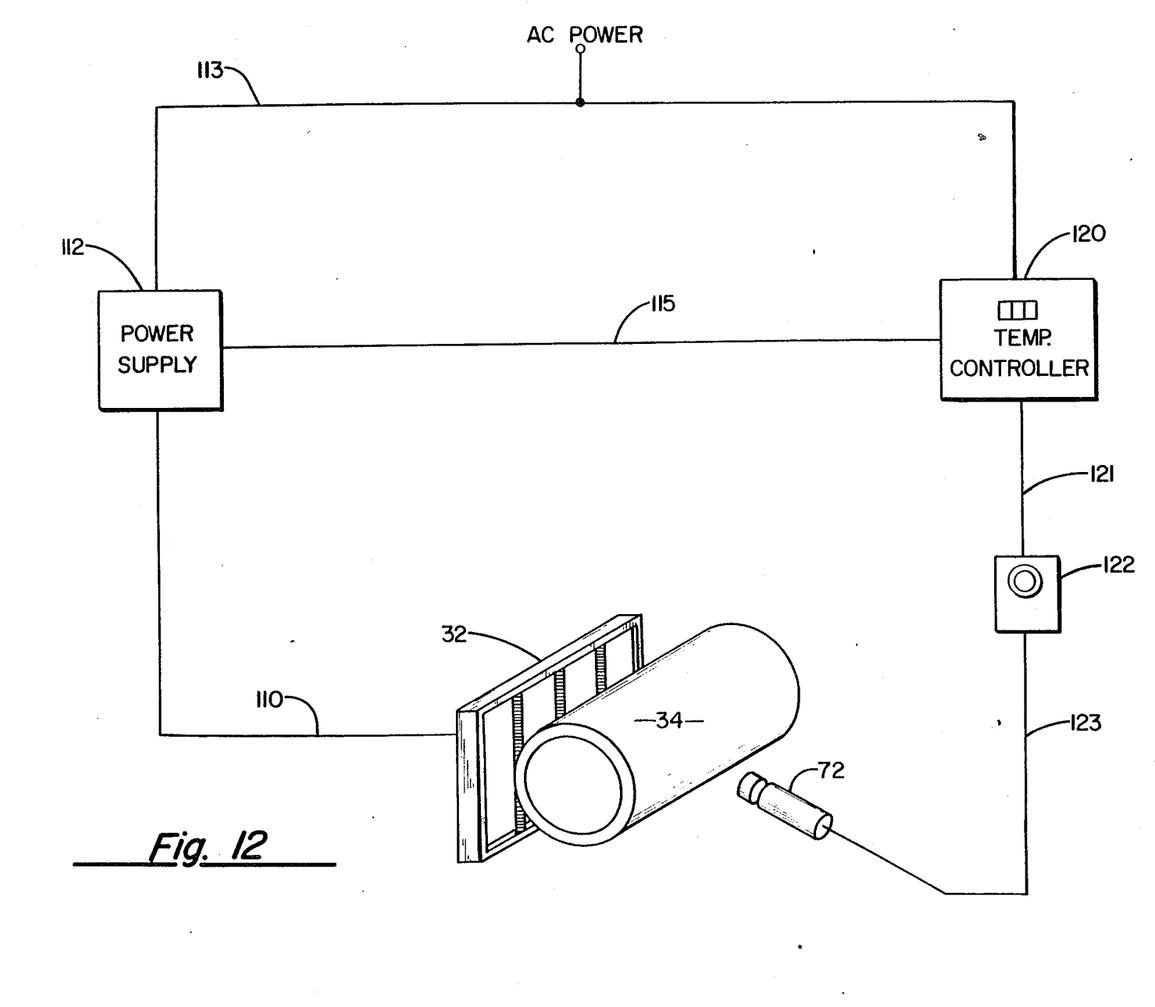
FIG. 12 shows a schematic block diagram of the heater of the present invention.

FIG. 12 shows the temperature control system which is used to achieve the desired control over narrow temperature ranges such as those provided with the above example. Print cylinder 34 is rotatably positioned close to a radiant heater 32. Radiant heater 32 is powered by electrical energy over line 110, which is connected to a voltage-controlled power supply 112. Radiant heater 32 is a rapid response electric infrared heater, that reaches its operating temperature in five to ten seconds when turned on, and loses heat rapidly when turned off. It provides heating energy in the range of 1,500–4,000 watts per square foot which may be transferred through radiation to print cylinder 34. One example of a radiant heater 32 which is useful with the present invention is sold under the trademark Radplane, series 80, by Glenro Inc. of Paterson, N.J.

Power supply 112 is a silicon-controlled-recitifier (SCR) proportional power controller and supply. The amount of electrical energy delivered over line 110 is a function of a control signal to power supply 112 which is developed on line 115. The control signal on line 115 controls the firing angle of the SCR devices in power supply 112, according to conventional techniques which are known in the art. Power supply receives its input electrical energy over line 113 from an AC power source, and, through control of the SCR firing angle, selectively delivers a proportion of the received power over line 110 to radiant heater 32. A typical power supply 112 may be obtained from Glenro Inc. under the model designation PRO-TROLLER, in any of a number of power delivery capabilities.

Power supply 112 receives its control signal over line 115 from temperature controller 120. A commercially available temperature controller which is useful for this purpose is manufactured by Watlow Winona, Inc. of Winona, Minn. under the model designation "Series 859" digital temperature controller. Temperature controller 120 delivers a DC control signal in the range of 4–20 millivolts (mv). Its output signal over line 115 is proportional to the input signal it receives on line 121. Line 121 is connected to a manual control 122, and is also connected via line 123 to temperature sensor 72.

Figure 13:
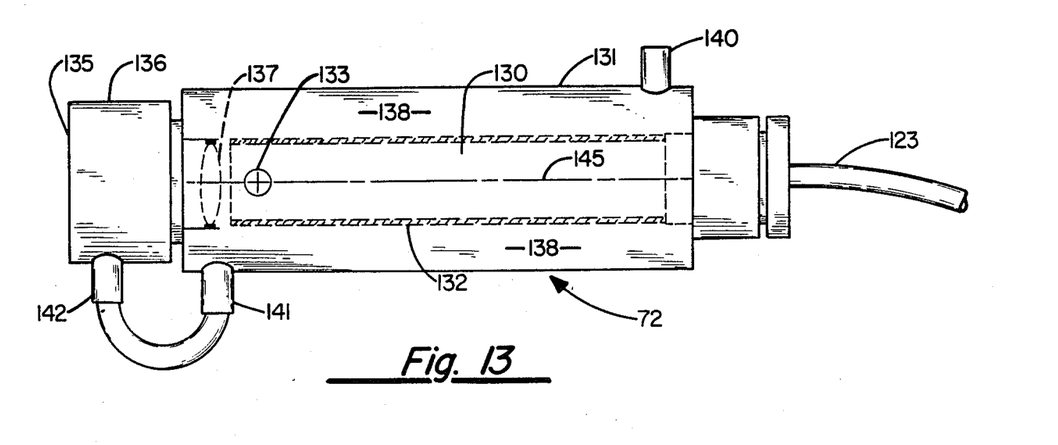
FIG. 13 shows the temperature sensor in partial cross section.

FIG. 13 shows temperature sensor 72 in cross sectional view. Temperature sensor 72 is generally cylindrical in shape, having an internal axial chamber 130, and an outer cylindrical housing 131. An insulation layer 132 is preferably placed about the inner walls of opening 130 in order to insulate the electrical components inside of housing 131 from external temperature effects. Temperature sensor 72 may be adapted from an infrared optical sensor available from IR-ONICS, Inc., of Warwick, R.I., and sold under the model designation TD-5/S22. Sensor 72 has an optical sensing element 133 which is sensitive to received radiant energy in the wavelength range of from 7 to 15 microns. All radiant energy received by sensor 72 is received through an opening 135 in a tubular shield 136 which is attached at the front of sensor 72. The radiant energy received through opening 135 is directed through a lens 137 to focus on optical sensing element 133. Optical sensing element 133 develops a signal proportional to the amount of energy received, which signal is amplified and processed in electronic circuitry in axial opening 130, and which signal is transmitted via line 123 to temperature controller 120.

A further feature of temperature sensor 72 is its construction for cooling the internal electronic components from adverse temperature affects of the environment. Temperature sensor 72 is located in the region between radiant heater 32 and print cylinder 47, in a region in which the heating effects of radiant heater 32 are confined by means of heating shroud 33. Therefore, the ambient temperature to which temperature sensor 72 becomes exposed is elevated. Temperature sensor 72 has an internal chamber 138 between housing 131 and insulating layer 132. Chamber 138 is coupled to an inlet port 140 and an exhaust port 141. Pressurized air may be coupled to inlet port 140, wherein the air passes through chamber 138 and is exhausted out via port 141. Further, exhaust port 141 is connected to a port 142 in tube 136. This exhaust air is passed into the region in front of lens 137, and serves to keep the lens clean and free from collected residue.

In operation, the axis 145 of temperature sensor 72 is aligned toward print cylinder 47. The radiant energy emitted from the surface of print cylinder 47 is received through the opening 135 and is focused by lens 137 upon optical sensor 133. This energy is a measure of the emissivity of print cylinder 47, and therefore represents the amount of heat energy which has been absorbed by print cylinder 47 and the liquid adhesive which adheres to the inner surface of print cylinder 47. A signal which is proportional to the energy emitted from the print cylinder is developed on line 123 and is transmitted to the temperature controller 120. This signal is therefore representative of the actual temperature of the print cylinder, and it may be adjustably varied by manual control 122, which operates as a gain control to temperature controller 120. As a result of receiving the temperature control signal, as modified by the gain control signal, temperature control 120 generates a firing angle control signal on line 115 which is transmitted to power supply 112. Power supply 112 develops an output signal on line 110 which is proportional to the firing angle control signal received on line 115, and thereby controls the amount of electrical energy being delivered to radiant heater 32. When the temperature sensed by temperature sensor 72 reaches the desired operating level, the feedback signal to control power supply 112 is reduced to zero, and the power signal developed on line 110 is also reduced to zero, thereby discontinuing the radiant energy delivered by radiant heater 32 until such time as a drop in temperature is again sensed by temperature sensor 72. In this manner, the temperature of print cylinder 34 may be precisely controlled, even as liquid adhesive material is being metered through the patterned openings in print cylinder 34.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A temperature control system for a heated rotary screen printing apparatus for delivering heated coating liquid from the inside of a rotating thin walled print cylinder through patterned openings therein, comprising,
    (a) an infrared sensor placed outside in non-contacting proximity to said print cylinder, said sensor having means for receiving radiant energy emitted from said print cylinder and means for generating a signal representative of said received radiant energy;
    (b) a rapid response radiant heater placed in proximity to said print cylinder, said heater having an input terminal for receiving electrical energy and having means for generating radiant heat energy in response to said recieved electrical energy;

(c) an electrical power source having an output connected to said input terminal and having a control signal input and means for varying the electrical energy delivered to said output in response to a signal applied to said control signal input; and
(d) means for receiving said infrared sensor signal representative of received radiant energy, and means for translating said signal into a control signal, and means for applying said control signal to said electrical power source control signal input. whereby the temperature of the coating liquid inside the cylinder is controlled by sensing the outside temperature of the printing cylinder 2. The apparatus of claim 1, further comprising a manually operated gain control coupled to said means for receiving said infrared sensor signal, said gain control having means for adjusting the magnitude of said control signal.

3. The apparatus of claim 1, wherein said infrared sensor further comprises a housing having internal air flow passages, and including means for applying pressurized air into said housing through said air flow passages.

4. The apparatus of claim 3, wherein said housing further comprises concentric tubular members and said passages further comprise the region between said concentric tubular members.

5. The apparatus of claim 4, further comprising a lens across an end of the inner of said concentric tubular members and an infrared detector in said inner tubular member positioned at the focal point of said lens.

6. The apparatus of claim 5, wherein said infrared detector further comprises a radiant energy detector responsive to received energy in the wavelength range of 7 to 15 microns.

7. The apparatus of claim 5, further comprising a shield attached to said housing and having means for receiving pressurized air and for deflecting said air toward said lens.

8. The apparatus of claim 3, further comprising an outlet air passage from said housing, and means for directing air from said outlet air passage toward said means for receiving radiant energy.

9. A temperature control system for a heated rotary screen printing apparatus for delivering heated coating fluid from the inside of a rotating thin walled print cylinder through patterned openings therein, comprising
  (a) a plurality of infrared sensors placed outside in noncontacting proximity to said print cylinder, said sensors having means for receiving radiant energy emitted from said print cylinder and means for generating a signal representative of said received radiant energy;
  (b) a rapid response radiant heater placed in proximity to said print cylinder, said heater having an input terminal for receiving electrical energy and having means for generating radiant heat energy in response to said received electrical energy, and said means for generating radiant heat energy having a plurality of heat zones longitudinally arrayed along the length of the print cylinder and each of said infrared sensors corresponding to one of said heating zones;
  (c) an electrical power source having outputs connected to said input terminal and having control signal inputs and means for varying the electrical energy delivered to said outputs in response to the signals applied to said control signal inputs; and
  (d) means for receiving said infrared sensor signals representative of received radiant energy from said of said heat zones, and means for translating said signals into control signals and means for applying said control signals to said electrical power source control signal inputs whereby the temperature of the coating liquid inside the cylinder is controlled by sensing the outside temperature of the printing cylinder.

10. The apparatus of claim 9, further comprising a manually operated gain control coupled to said means for receiving said infrared sensor signals, said gain control having means for adjusting the magnitude of said control signals.

11. The apparatus of claim 9, wherein each of said infrared sensors further include a housing having internal air flow passages, and including means for applying pressurized air into said housing through said air flow passages.

12. The apparatus of claim 11, wherein each said housing further comprises concentric tubular members and said passages further comprise the region between said concentric tubular members.

13. The apparatus of claim 12, further comprising a lens across and end of each of the inner of each of said concentric tubular members and an infrared detector in each said inner tubular member positioned at the focal point of said lens.

14. The apparatus of claim, wherein each said infrared detector further comprises a radiant energy detector responsive to received energy in the wave length range of 7 to 15 microns.

15. The apparatus of claim 13, further comprising a shield attached to each said housing and having means for receiving pressurized air and for deflecting said air towards said lenses.

16. The apparatus of claim 11, further comprising outlet air passages from each of said housings, and means for directing air from each of said outlet air passages toward each said means for receiving radiant energy.

* * * * *

UNITED STATES PATENT AND TRADEMARK OFFICE
CERTIFICATE OF CORRECTION

PATENT NO. : 4,693,179

DATED : September 15, 1987

INVENTOR(S) : John Watts

It is certified that error appears in the above-identified patent and that said Letters Patent is hereby corrected as shown below:

In column 22, line 15, "said" should be -- each--; in column 22, line 43, claim 14, "of claim" should be -- of claim 13 --.

Signed and Sealed this

Sixteenth Day of February, 1988

Attest:

DONALD J. QUIGG

Attesting Officer

Commissioner of Patents and Trademarks